United States Patent [19]
Tewinkle et al.

[11] Patent Number: 6,133,952
[45] Date of Patent: Oct. 17, 2000

[54] SYSTEM FOR DETECTING DEFECTIVE PHOTOSENSORS IN AN IMAGE SENSOR ARRAY

[75] Inventors: Scott L. Tewinkle, Ontario; Jagdish C. Tandon, Fairport; Paul A. Hosier, Rochester, all of N.Y.

[73] Assignee: Xerox Corporation, Stamford, Conn.

[21] Appl. No.: 08/934,865

[22] Filed: Sep. 22, 1997

[51] Int. Cl.[7] .................................................... H04N 9/64
[52] U.S. Cl. ...................... 348/246; 250/214 R; 250/207
[58] Field of Search .................................... 348/207, 294, 348/300, 301, 302, 303, 304, 308, 311, 246, 247; 250/208.1, 214 R; H04N 5/335, 9/64

[56] References Cited

U.S. PATENT DOCUMENTS

| 5,081,536 | 1/1992 | Tandon et al. . |
|---|---|---|
| 5,451,768 | 9/1995 | Hosier et al. . |
| 5,452,001 | 9/1995 | Hosier et al. . |
| 5,638,121 | 6/1997 | Hosier et al. . |
| 6,054,704 | 4/2000 | Prichard et al. ......................... 348/302 |
| 6,061,093 | 5/2000 | Yonemoto ................................ 348/305 |

*Primary Examiner*—Tuan Ho
*Attorney, Agent, or Firm*—R. Hutter

[57] ABSTRACT

A test circuit incorporated as part of an image sensor array having a plurality of image sensors and associated transfer circuits includes a test line associated with each photosensor. In a test mode, a signal output from a photosensor can be substituted with a predetermined voltage from an external source. By providing a predetermined test voltage to the transfer circuits and then reading out signals from the transfer circuits, faults in the transfer circuits can be isolated from faults in the photosensors.

5 Claims, 2 Drawing Sheets

SYSTEM FOR DETECTING DEFECTIVE PHOTOSENSORS IN AN IMAGE SENSOR ARRAY

INCORPORATION BY REFERENCE

The present application incorporates by reference U.S. Pat. Nos. 5,081,536 and 5,638,121, both assigned to the assignee hereof.

1. Field of the Invention

The present invention relates to image sensor arrays used in raster input scanners. In particular, the invention relates to photosensitive chips wherein each photosensor has its own individual transfer circuit.

2. Background of the Invention

Image sensor arrays typically comprise a linear array of photosensors which raster scan an image bearing document and convert the microscopic image areas viewed by each photosensor to image signal charges. Following an integration period, the image signal charges are amplified and transferred as an analog video signal to a common output line or bus through successively actuated multiplexing transistors.

For high-performance image sensor arrays, a preferred design includes an array of photosensors of a width comparable to the width of a page being scanned, to permit one-to-one imaging generally without the use of reductive optics. In order to provide such a "full-width" array, however, relatively large silicon structures must be used to define the large number of photosensors. A preferred technique to create such a large array is to make the array out of several butted silicon chips. In one proposed design, an array is intended to be made of 20 silicon chips, butted end-to-end, each chip having 248 active photosensors spaced at 400 photosensors per inch.

Although most scanning systems currently in use are ultimately digital systems, the "raw signal" coming out of the photosensors during the scanning process is an analog video signal, with the voltage magnitude corresponding to the intensity of light impinging on the photosensor at a given time. Thus, when signals are read out from the photosensors on a chip to be converted to digital data, different video levels, corresponding, generally, to the brightness of the reflected area being scanned by a particular photosensor at a particular moment, are output as a series of analog voltage levels.

In a video-outputting chip, the total speed of output of each chip will depend on the voltage response of the output channel. Each chip outputs a sequence of voltage levels, each voltage level corresponding to a pixel in the original image. With each pixel in the original image, the voltage level must move from a signal representative of light of the previous pixel to one representative of light in the present pixel. Because of the analog nature of a video-outputting chip, the sequence of voltage outputs from one voltage level (corresponding to one pixel) to the next is a set of asymptotic curves. When the outputs of a plurality of photosensors are read out serially, certain time must be allowed between each photosensor reading to allow the reading to settle to the value of a signal corresponding to the light impinging on the photosensor. In a typical practical system for reading out the video signals, this readout time for real-time scanning is approximately 50 nanoseconds per photosensor. With each pixel signal, what is of most interest is where the analog voltage curve "ends up"—that is, the final value of the voltage signal is what is representative of the true light intensity on the photosensor. When a set of analog video signals are output over time, the portion of the output for each pixel in which the voltage level starts moving from the voltage level from the previous pixel to the voltage level of the present pixel is the settling time, which directly affects readout time.

As practical applications of image sensor arrays typically require several semiconductor chips being butted to form a longer array, it is important to provide for the testing of the individual chips before the chips are mounted in a longer array. To find that a particular chip, or an individual sensor or transfer circuit in the chip, is defective after installation in an array will require that the chip be removed from the array, an expensive and time-consuming process. It is therefore more desirable to provide systems within the structure of the chip itself to permit testing of individual photosensors and/or transfer circuits before the chips are installed on the array, or more preferably before the chips are even diced from a wafer.

An object of the present invention is to provide an image sensor array in which circuitry useful for testing circuitry associated with individual photosensors is included in the chip design.

3. Description of the Prior Art

U.S. Pat. No. 5,081,536 discloses the basic function of an image sensor array wherein each of a plurality of photosensors is associated with a two-stage transfer circuit, and signals on each transfer circuit are sequentially selected by a shift register.

U.S. Pat. No. 5,451,768 discloses an image sensor array with two-stage transfer circuits, which further includes an on-chip test circuit whereby a desired bias to be placed on each photosensors can be externally tested.

U.S. Pat. No. 5,452,001 discloses a photosensor readout scheme for an image sensor array in which signals on each transfer circuit are sequentially selected by a shift register.

U.S. Pat. No. 5,638,121 discloses a photosensor readout scheme for an image sensor array in which signals on each transfer circuit are sequentially selected by a shift register and wherein the signals from odd and even photosensors are read out onto separate output lines.

SUMMARY OF THE INVENTION

According to the present invention, there is provided an image sensor array, comprising a plurality of photosensors, an output line, and a plurality of connectors. A connector is associated with each of the plurality of photosensors, the connector selectably connecting the photosensor to the output line. A selector is provided for selecting one of the plurality of photosensors to output a signal on the output line by closing the connector associated with the selected one of the plurality of photosensors. A test line is provided for connecting a connector to a source of a predetermined voltage in lieu of a signal from the photosensor associated with said connector.

DETAILED DESCRIPTION OF THE INVENTION

Figure 1:
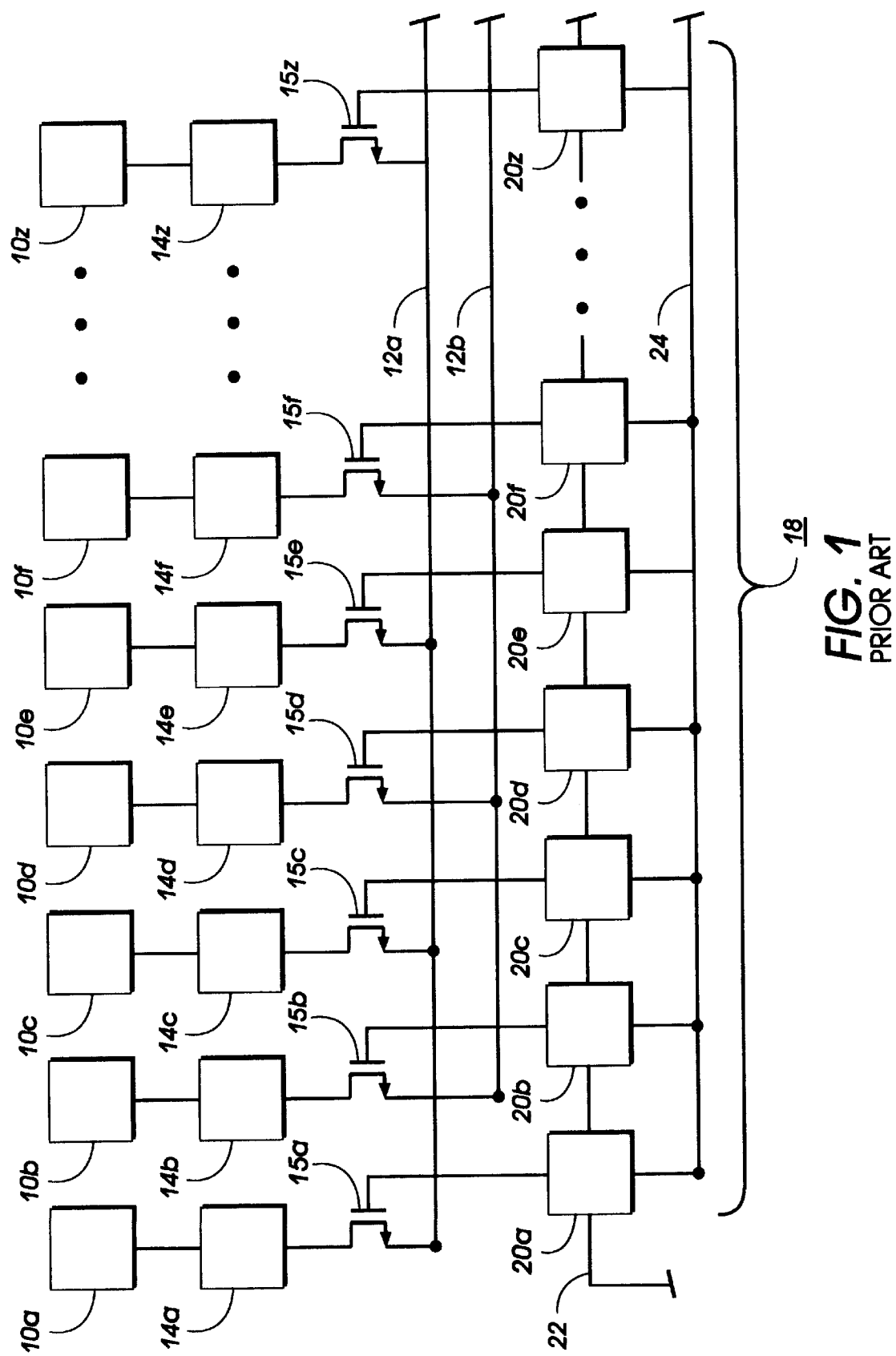
FIG. 1 is a simplified schematic showing an arrangement of circuit elements for the readout system of the present invention.

FIG. 1 is a schematic view showing the basic elements of a readout system according to the present invention. There is provided a set of photosensors 10a–10z, which are connected by transfer circuits 14a, 14b, etc. which in turn are activated by a selector in the form of shift register 18. Shift register 18 includes a set of half-stages 20a, 20b, etc., which are arranged along a single line 22, and are activated by a pixel clock line 24. Significantly, in this design, there is disposed between each transfer circuit 14 and an associated output line, or video line, 12 a selector switch, or connector, 15a, 15b, etc. which is associated with one corresponding stage or half-stage 20a, 20b, etc., of shift register 18; when the appropriate stage or half-stage of shift register 18 is activated, the base of the associated connector 15 closes a connection between the transfer circuit 14 and the video line.

According to one embodiment of the present invention, the linear array of photosensors 10a . . . 10z are arranged in an interleaved manner with odd and even subsets, with the odd subsets of photosensors such as 10a and 10c connected via their associated transfer circuits 14a, 14c, etc. to an odd video line 12a, and the even photosensors such as 10b and 10d, connected via their associated transfer circuits 14b, 14d, etc. to an even video line 12b. Video line 12a receives the video outputs only of the odd photosensors, and the even video line 12b receives the video outputs only of the even photosensors. Because both the odd and even photosensors are controlled by a single shift register 18, having half-stages 20a, 20b, etc., the parallel video signals on odd video line 12a and even video line 12b can be output in parallel; further the odd and even video signals can be arranged to be staggered over time.

(In the art of shift registers, a "stage" is defined as a portion of a shift register that is altered with a single clock pulse, so each odd and even pair of half-stages such as 20a and 20b form a single stage according to the strict definition. However, in the specification and claims herein, the word "stage" in this context shall also apply to a half-stages in a shift register of the illustrated design. Also, according to the invention, it is possible that a connector such as 15 responsive to the shift register 18 could be effectively incorporated into the design of the transfer circuit 14.)

Figure 2:
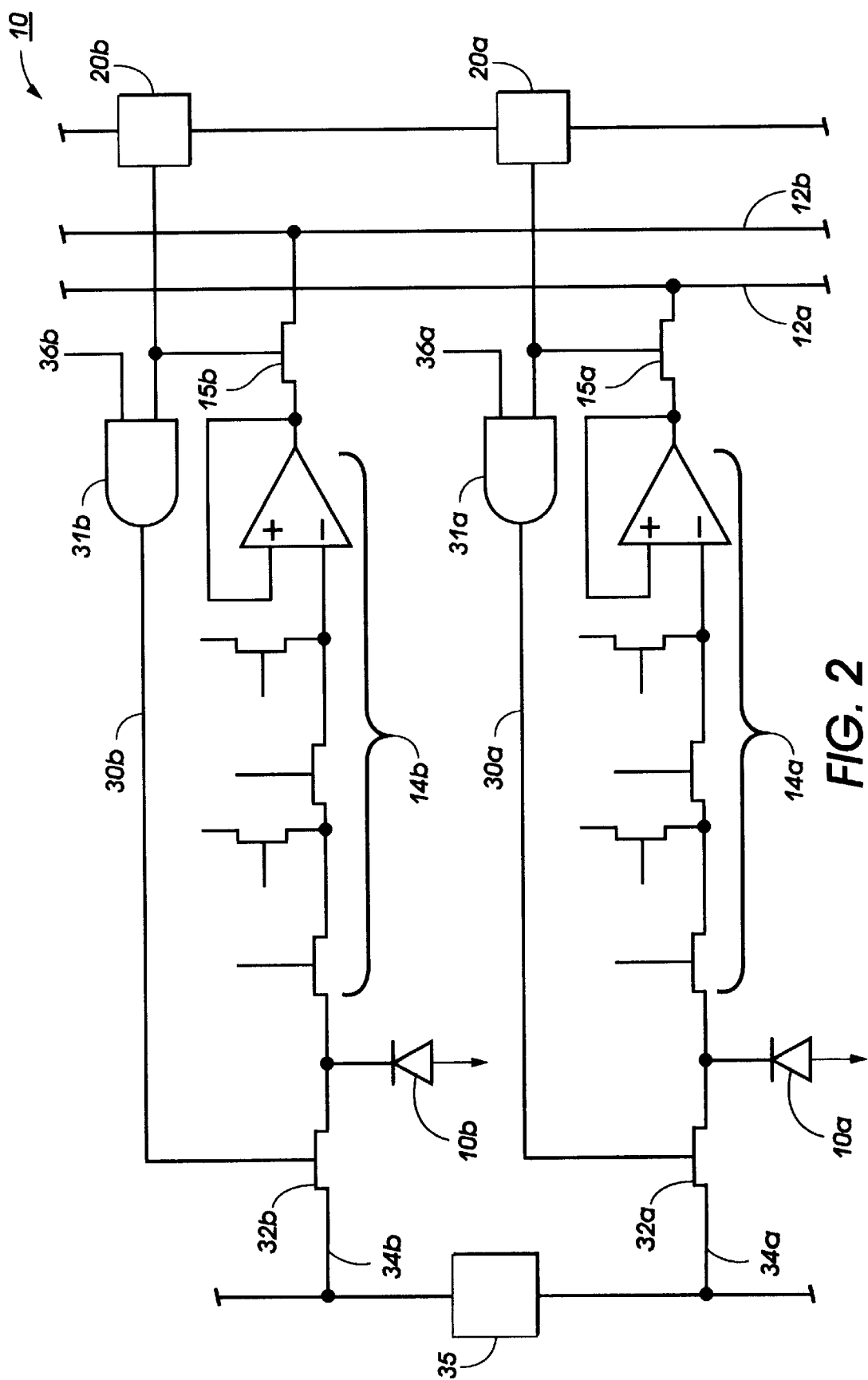
FIG. 2 is a schematic diagram showing, in detail, the circuitry associated with two photosensors in an image sensor array incorporating the present invention.

FIG. 2 is a detailed schematic diagram showing two image sensor circuits in a linear array incorporating the test mode ability of the present invention. In FIG. 2, a photosensor 10a outputs a signal through a transfer circuit with amplifier, generally indicated as 14a, onto a video line 12a; similarly, a photosensor 10b outputs a signal via a transfer circuit and amplifier generally indicated as 14b to a video line 12b. The transfer circuits such as 14a, 14b include any number of switches and biases, the operation of which is discussed in detail at, for example, U.S. Pat. No. 5,081,536, incorporated by reference above. Further, in both cases a connector shown respectively as 15a, 15b is used to make the final connection between a transfer circuit 14 and the associated output line 12a or 12b. The connector 15a, 15b is ultimately connected at the gate thereof to one stage or half-stage, such as 20a or 20b, in shift register 18, in the manner described above.

According to one embodiment of the present invention, there is further provided, associated with each photosensor such as 10a, 10b, what is here called a "selection line" 30a or 30b, which extends from the same line through which connector 15a, 15b is associated with a stage in the shift register 18, but which further extends, via an AND gate such as 31a, 31b, to a switch 32a, 32b which is in parallel with the output of the associated photosensor such as 10a, 10b. This switch 32a, 32b is arranged to bias, when closed, the transfer circuit with an external voltage from a "test line" 34a or 34b, which ultimately connects to an external source, here indicated as 35, of a predetermined fixed voltage. As illustrated in FIG. 2, when the selection line 30a, 30b is high, the switch 32a, 32b causes a connection between the voltage source 35 on test line 34a or 34b so that the predetermined bias from test line 34a or 34b is caused to load a predetermined bias into one of the transfer circuits 14a, 14b, in effect in lieu of an output from a photosensor such as 10a, 10b.

Typically, when a chip having a sensor array is in a test mode, the chip is placed in the dark, so that there should be no significant electrical output from any of the photosensors 10a, 10b, etc., and in such a case when the switch 32a, 32b is closed, the only signal entering into one of the transfer circuits 14a, 14b is the predetermined bias from source 35 on test line 34a or 34b. (Depending on a particular design of an image sensor array, the various lines 34 associated with each of a large number of image sensors may be attached by a common bus to the voltage source 35, which may or may not be located on the chip itself.)

It will be noted that disposed on selection line 30a, 30b is an AND gate 3a, 31b. One of the inputs into the AND gate is of course the line from a stage 20a, 20b of shift register 18, which is also used to close the connector 15a, 15b when a particular photosensor is desired to be activated; the other input into the AND gate such as 3a, 31b is what is here called an "enable" line 36a, 36b, which is ultimately connected to some means (such as bonding pad) which can be activated externally when it is desired to place the chip in a test mode. As can be seen by the arrangement of circuit elements in FIG. 2, when the enable line is activated for any or all image sensors, the connection is made between a stage 20a, 20b from shift register 18 through AND gate 3a, 31b, thus closing the switch 32a, 32b and permitting the predetermined bias from test line 34a, 34b to be loaded into the transfer circuit 14a, 14b.

In this way, the usual readout process along shift register 18 is used to cause a series of image sensors to read out outputs using a "controlled input" of the predetermined voltage from lines 34a, 34b, instead of reading out any signals from photosensors 10, 10b. The behavior of the transfer circuits 14a, 14b can thus be tested independently from their associated photosensors 10a, 10b. When the enable line is deactivated, the chip can thus leave test mode and enable actual readouts from the photosensors 10a, 10b to be loaded into the transfer circuits 14a, 14b.

When the image sensor array is in test mode, various techniques can be applied to test the behavior of individual transfer circuits. For instance, if the voltage input on test lines 34a, 34b, etc., is kept at a constant level, and the outputs of the transfer circuits are read out, deviations from an equal output from all transfer circuits can identify defective transfer circuits. Similarly, loading an alternating fixed voltage (such as a square wave, at various frequencies) into the test lines while reading out outputs from the transfer circuits can be used to measure response times of various transfer circuits. It is also possible to provide independently-controllable test lines for the odd and even photosensors in the array, so that, for instance, only an even subset of transfer circuits will have an input therein; this may be useful in making fine determinations of transfer circuit behavior.

The present invention differs from the above referenced U.S. Pat. No. 5,451,768, of which certain of the present co-inventors were co-inventors, in that the '768 patent is directed to placing an external test bias at a specific place in a transfer circuit, for the specific purpose of biasing the photosensor. The initial photosensor bias is indeed an important parameter in determining the response of the photosensor, but the present invention is directed to providing a test bias which in effect replaces any signal from the photosensor, so that the transfer circuit can be tested independently of its associated photosensor. The external bias in the '768 patent is placed at a point where it will influence the photosensor, while in the present invention, the photosensor is isolated from the system while the apparatus is in test mode, and so any bias on the photosensor is not of direct interest to the present invention.

While this invention has been described in conjunction with various embodiments, it is evident that many alternatives, modifications, and variations will be apparent to those skilled in the art. Accordingly, it is intended to embrace all such alternatives, modifications, and variations as fall within the spirit and broad scope of the appended claims.

What is claimed is:

1. An image sensor array, comprising:

a plurality of photosensors;

an output line;

a plurality of connectors, a connector associated with each of the plurality of photosensors, each connector selectably connecting the photosensor associated therewith to the output line;

a selector for selecting one of the plurality of photosensors to output a signal on the output line by closing the connector associated with the selected one of the plurality of photosensors; and a test line for connecting a connector to a source of a predetermined voltage in lieu of a signal from the photosensor associated with said connector.

2. The image sensor array of claim 1, further comprising a switch interposed between the test line and the connector, the switch operating to connect the test line to the connector; and a selection line interposed between the selector and the switch, enabling the switch to connect the test line to the connector in response to a signal from the selector.

3. The image sensor array of claim 1, the selector comprising a shift register having a plurality of stages in series, each of said stages being associated with one connector.

4. The image sensor array of claim 1, further comprising a transfer circuit interposed between each photosensor and a connector.

5. An image sensor array, comprising:

a plurality of photosensors;

an output line;

a plurality of connectors, a connector associated with each of the plurality of photosensors, each connector selectable connecting the photosensor associated therewith to the output line;

a selector for selecting one of the plurality of photosensors to output a signal on the output line by closing the connector associated with the selected one of the plurality of photosensors; and a test line for connecting a connector to a source of a predetermined voltage in lieu of a signal from the photosensor associated with said connector;

a switch interposed between the test line and the connector, the switch operating to connect the test line to the connector;

a selection line interposed between the selector and the switch, enabling the switch to connect the test line to the connector in response to a signal from the selector; and an AND gate disposed on the selection line between the selector and each switch, the AND gate having an input connected to an external signal line, the external signal line enabling the AND gate to complete the selection line when a predetermined signal is applied thereto.

* * * * *